United States Patent [19]
Kardauskas

[11] Patent Number: 5,994,641
[45] Date of Patent: Nov. 30, 1999

[54] SOLAR MODULE HAVING REFLECTOR BETWEEN CELLS

[75] Inventor: Michael J. Kardauskas, Billerica, Mass.

[73] Assignee: ASE Americas, Inc., Billerica, Mass.

[21] Appl. No.: 09/066,157

[22] Filed: Apr. 24, 1998

[51] Int. Cl.⁶ .................................................. H01L 25/00
[52] U.S. Cl. ................................. 136/246; 438/71; 438/72
[58] Field of Search ............................. 136/246; 438/71, 438/72

[56] References Cited

U.S. PATENT DOCUMENTS 4,235,643  11/1980  Amick ...................................... 136/246
5,554,229   9/1996  Vogeli ...................................... 136/259

OTHER PUBLICATIONS

J.A. Amick et al, "V–Groove Faceted Reflector For Enhanced Module Output", pp. 1376–1381, Record of IEEE Photovoltaic Specialists Conference—1981.

*Primary Examiner*—Mark Chapman
*Attorney, Agent, or Firm*—Pandiscio & Pandiscio

[57] ABSTRACT

A photovoltaic module comprising an array of electrically interconnected photovoltaic cells disposed in a planar and mutually spaced relationship between a light-transparent front cover member in sheet form and a back sheet structure is provided with a novel light-reflecting means disposed between adjacent cells for reflecting light falling in the areas between cells back toward said transparent cover member for further internal reflection onto the solar cells. The light-reflecting comprises a flexible plastic film that has been embossed so as to have a plurality of small V-shaped grooves in its front surface, and a thin light-reflecting coating on said front surface, the portions of said coating along the sides of said grooves forming light-reflecting facets, said grooves being formed so that said facets will reflect light impinging thereon back into said transparent cover sheet with an angle of incidence greater than the critical angle, whereby substantially all of the reflected light will be internally reflected from said cover sheet back to said solar modules, thereby increasing the current output of the module.

36 Claims, 4 Drawing Sheets

SOLAR MODULE HAVING REFLECTOR BETWEEN CELLS

This invention was made under Department of Energy Subcontract No. NERL-ZAF-6-14271-13.

FIELD OF THE INVENTION

This invention relates to an improved solar cell module having reflector means designed to utilize light impinging on areas between the cells which would normally not be utilized in photoelectric conversion, thereby increasing the power output of the cell.

BACKGROUND OF THE INVENTION

Photovoltaic solar cells for directly converting radiant energy from the sun into electrical energy are well known. The manufacture of photovoltaic solar cells involves provision of flat semiconductor substrates having a shallow p-n junction adjacent one surface thereof (commonly called the "front surface"). Such substrates are often referred to as "solar cell wafers". A typical solar cell wafer may take the form of a rectangular EFG-grown polycrystalline silicon substrate of p-type conductivity having a thickness in the range of 0.010 to 0.018 inches and a p-n junction located about 0.3–0.5 microns from its front surface. Circular or square single crystal silicon substrates and rectangular cast polycrystalline silicon substrates also are commonly used to make solar cells. The solar cell wafers are converted to finished solar cells by providing them with electrical contacts (sometimes referred to as "electrodes") on both the front and rear sides of the semiconductor substrate, so as to permit recovery of an electrical current from the cells when they are exposed to solar radiation. These contacts are typically made of aluminum, silver, nickel or another metal or metal alloy. A common preferred arrangement is to provide silicon solar cells with rear contacts made of aluminum and front contacts made of silver. The contact on the front surface of the cell is generally in the form of a grid, comprising an array of narrow fingers and at least one elongate bus (commonly called a "bus bar") that intersects the fingers. The width and number of the fingers and bus bars are selected so as to maximize the output current.

Further, to improve the conversion efficiency of the cell, it is accepted practice to form on the front surfaces of the solar cells an electrically non-conducting anti-reflection ("AR") coating that is transparent to solar radiation. In the case of silicon solar cells, the AR coating is often made of silicon nitride or an oxide of silicon or titanium. Typically the AR coating is about 800 Angstroms thick. The AR coating overlies and is bonded to those areas of the front surface of the cell that are not covered by the front contact, except that at least a portion of the front contact (usually a bus bar) is not covered with the AR coating, so as to permit making a soldered connection to that contact.

Photovoltaic solar cells (e.g., silicon solar cells) are relatively small in size, typically measuring 2–4 inches on a side in the case of cells made from rectangular EFG-grown substrates, with the result that their power output also is small. Hence, industry practice is to combine a plurality of cells so as to form a physically integrated module with a correspondingly greater power output. Several solar modules may be connected together to form a larger array with a correspondingly greater power output.

The usual practice is to form a module from two or more "strings" of solar cells, with each string consisting of a plurality of cells arranged in a straight row and electrically connected in series, and the several strings being arranged physically in parallel with one another so as to form an array of cells arranged in parallel rows and columns with spaces between adjacent cells. The several strings are electrically connected to one another in a selected parallel and/or series electrical circuit arrangement, according to voltage and current requirements. A common practice is to use solder coated copper wire, preferably in the form of a flat ribbon, to interconnect a plurality of cells in a string, with each ribbon being soldered to the front or back contact of a particular cell, e.g., by means of a suitable solder paste.

For various reasons including convenience of manufacture and assembly, cost control, and protection of the individual cells and their interconnections, it has been common practice for such modules to have laminated structures. These laminated structures consist of front and back protective sheets, with at least the front sheet serving as a cover and being made of clear glass or a suitable plastic material that is transparent to solar radiation, and the back sheet serving as a support for the cells and being made of the same or a different material as the front sheet. Disposed between the front and back sheets so as to form a sandwich arrangement are the solar cells and a light-transparent polymer material that encapsulates the solar cells and is also bonded to the front and back sheets so as to physically seal off the cells. The laminated sandwich-style structure is designed to mechanically support the cells and also to protect the cells against damage due to environmental factors such as wind, snow, rain, ice, and solar radiation. The laminated structure typically is fitted into a metal frame which provides mechanical strength for the module, and facilitates combining it with other modules so as to form a larger array or solar panel that can be mounted to a support that is arranged to hold the array of cells at the proper angle to maximize reception of solar radiation.

The art of making solar cells and combining them to make laminated modules is exemplified by the following U.S. Pat. Nos.: 4,751,191 (R. C. Gonsiorawski et al.); 5,074,920 (R. C. Gonsiorawski et al.), 5,118,362 (D. A. St. Angelo et al.); 5,178,685 (J. T. Borenstein et al.); 5,320,684 (J. Amick et al); and 5,478,402 (J. I. Hanoka). The teachings of those patents are incorporated herein by reference thereto.

Unfortunately, when a plurality of cells are arrayed in a module, the total active surface area of the array (i.e., the active area of the front faces of the solar cells) is less than the total area exposed to radiation via the transparent front protective sheet. For the most part this is due to the fact that adjacent cells do not touch each other and also the cells at the periphery of the array may not extend fully to the outer edges of the front protective sheet. Consequently less than all of the solar radiation which is received by the module impinges on active solar cell areas, with the remainder of the received solar radiation impinging on any inactive areas that lie between the cells or border the entire array of cells.

As noted in U.S. Pat. No. 4,235,643, issued Nov. 25, 1980 to James A. Amick for "Solar Cell Module", a number of techniques have been proposed for increasing the efficiency and effectiveness of solar cell modules by concentrating incident solar radiation onto active cell areas. For example, U.S. Pat. No. 2,904,612 describes a reflector-type device in which the land areas between the circular solar calls consist essentially of inverted intersecting frustums of cones circumscribing the cells. Another technique employed to enhance solar cell module output is the use of lenses. Thus U.S. Pat. No. 3,018,313 describes a solar cell module which has an array of lenses covering the module so as to concentrate the light impinging on the cover of the solar cell array to converge downwardly toward the active solar cell area. In U.S. Pat. No. 4,053,327, yet another light focusing arrangement is described wherein the cover of a solar cell module comprises a plurality of converging lenses arranged so as to direct the light incident on the module so that it does not fall on the grid lines of the front electrode of the solar cells in the array.

The Amick patent discloses an improvement over such prior efforts which comprises providing between adjacent cells an optical medium having a plurality of light-reflective facets that are angularly disposed so as to define a plurality of grooves having a depth in the range of 0.001" to 0.025", with the angle at the vertex formed by two mutually converging facets being between 110° and 130°, preferably about 120°, with the result that light impinging on those facets will be reflected back into the transparent front cover member at an angle φ greater than the critical angle, and then reflected again internally from the front surface of the cover member so as to impinge on the solar cells. The term "critical angle" refers to the largest value which the angle of incidence may have for a ray of light passing from a more dense optical medium to a less dense optical medium. If the angle of incidence φ exceeds the critical angle, the ray of light will not enter the less dense medium (e.g., air) but will be totally internally reflected back into the denser medium (e.g., the transparent cover sheet).

Amick U.S. Pat. No. 4,235,643 suggests (in column 4) that the faceted region is substantially coplanar with the solar cells and preferably the vertical height of a facet will be equal to the thickness of the solar cell. In column 5 of the Amick patent it is stated that the grooves are machined or molded in the optical medium.

Further information about the Amick invention is provided by the technical paper published by James A. Amick and William T. Kurth, "V-Groove Faceted Reflector For Enhanced Module Output", pp. 1376–1381, Record of IEEE Photovoltaic Specialists Conference—1981. In said article, the authors disclose that the faceted reflector was made of acrylic plastic and had a thin aluminum reflecting layer, with the repeat spacing (peak-to-peak spacing) of the facets being 0.070 inches.

However, the Amick reflector invention was not a commercial success. A primary limitation of the Amick invention was the inability to provide a satisfactory reflector medium at an acceptable cost.

Consequently, notwithstanding the advantages made in the recent years in increasing the energy conversion efficiency of solar cells, there still remains a very definite need for improving the ability of a solar cell module to capture and use available light energy and, more importantly, do so using a reflector medium that is relatively inexpensive to manufacture and is easy to use.

OBJECTS AND SUMMARY OF THE INVENTION

A primary object of the present invention is to provide an improved photovoltaic solar cell module having novel reflector means for increasing its power output.

Another object of the present invention is to provide an improved solar cell module comprising a plurality of solar cells arrayed in rows and columns between first and second support sheets, at least one of said sheets being transparent to solar radiation, and novel flexible reflector means disposed between said cells for increasing the amount of radiation received by said cells through said transparent sheet.

Still another object is to provide a module of the type described that comprises one or more concentrator members in the form of a thermoplastic film having a plurality of parallel grooves coated with a light-reflecting coating.

Another object is to provide a method of improving a solar module by incorporation therein of a novel solar energy reflector that operates so as to cause an increase the module's output current.

A further object is to provide an improved method of manufacturing a solar module.

These and other objects and advantages of the invention are achieved by providing a novel photovoltaic module comprising an array of electrically interconnected photovoltaic cells disposed in a planar and mutually spaced relationship between a transparent front planar cover member in sheet form and a back support structure, with at least said front cover member being transparent to solar radiation, and a novel light-reflecting means disposed between adjacent cells for reflecting light falling in the area between cells back toward said transparent cover member for further internal reflection onto the solar cells. More specifically, the solar cell module of the present invention comprises a plurality of mutually-spaced solar cells arrayed in a planar arrangement of rows and columns on a planar surface of the back sheet structure, with areas of said planar surface between the solar cells being covered by a novel optically-reflective textured sheet material having a plurality of facets disposed in a predetermined angular relationship with respect to said cover member and each other, so that light impinging thereon through the front cover member will be reflected upwardly back to the transparent cover member and then backwards toward active areas of the cells. In accordance with this invention, the optically reflective textured sheet material has a thickness substantially less than the thickness of the solar cells and comprises (1) a substrate in the form of a thin and flexible thermoplastic film that has been embossed so as have a plurality of substantially flat-sided grooves of predetermined configuration, and (2) a light-reflecting coating on said substrate in the form of a metallic film (or a reflective film comprised of multiple dielectric layers, as further described hereinafter) that extends along said grooves and forms a plurality of discrete light-reflecting facets, said grooves having a geometry such that incident light normal to the solar cell module will be reflected from said facets back into said transparent planar cover member and the angle of incidence of such reflected lighter at said transparent cover member will be greater than the critical angle, whereby substantially all of said reflected light will be directed by further reflection from said transparent cover member back to said solar cells, thereby increasing the power output of the module. Preferably the light-reflecting coating is a thin film of a metal having a high reflectivity, e.g., silver and aluminum.

In one preferred embodiment the optically reflective sheet material is formed with grooves running in a single direction, but pieces of said material are positioned in the spaces between cells so that the grooves extend in one direction between rows of cells and in a different direction between columns of said cells. Another embodiment is characterized by having (1) a sheet of said optically reflective material, with grooves all running parallel to one another, underlying all of the solar cells and extending across the spaces between the cells, and (2) strips of said same material disposed between rows (or columns) of said cells so that the grooves in said strips extend at a right angle to the grooves in said sheet underlying said cells. In other embodiments the textured material is made or arranged with grooves running in at least two different directions. Other embodiments, features and advantages of the invention will be apparent from the following specification and the drawings wherein like numerals are used throughout to identify like parts.

In the several drawings, the relative thicknesses of the plastic film and metal layer that make up the flexible light-reflective laminated material are exaggerated in relation to the other solar module components solely for convenience of illustration.

Figure 1:
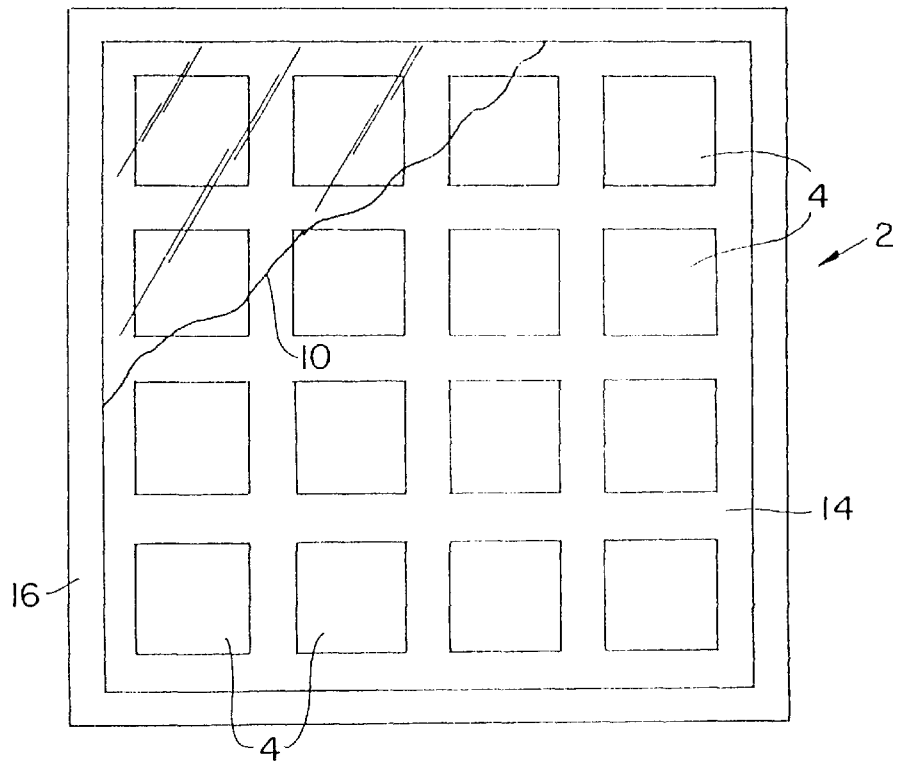
FIG. 1 is a plan view of a conventional solar cell module, with part of the transparent cover member broken away.
Figure 2:
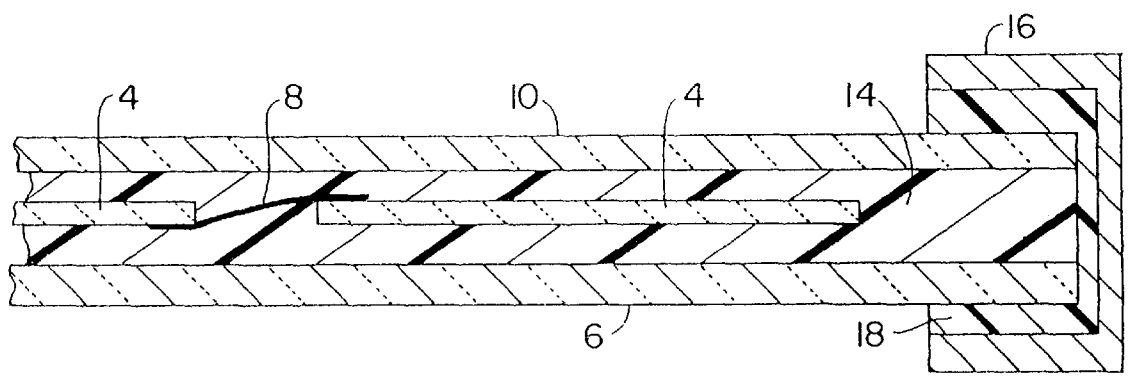
FIG. 2 is a fragmentary diagrammatic sectional view of a portion of the module of FIG. 2.

FIGS. 1 and 2 illustrate a conventional solar cell module 2 comprising a plurality of rectangular solar cells 4. The kind of solar cells used in the module may vary. Preferably, but not necessarily, the module comprises silicon solar cells. Although not shown, it is to be understood that each solar cell comprises a front contact on its front surface in the form of a grid comprising an array of narrow, elongate parallel fingers interconnected by one or more bus bars, and a rear contact on its rear surface, with the cells made substantially as illustrated and described in said above-identified U.S. Pat. Nos. 4,751,191, 5,074,920, 5,118,362, 5,178,683, 5,320,684 and 5,478,402. The module also comprises a back protector member in the form of a sheet or plate 6 that may be made of various materials and may be stiff or flexible. Preferably the back protector sheet 6 is an electrically insulating material such as glass, a plastic, a plastic reinforced with glass fibers or a wood particle board. A preferred back protector member is Tedlar®. The solar cells are arranged in parallel rows and columns and are interconnected by electrical leads 8 which usually are in the form of flat copper ribbons. The usual practice in making a solar module is to interconnect the cells in each row in series so as to form strings, and then connect the strings in series or in parallel, or in some series/parallel combination, according to the voltage and current requirements of electrical system into which the module is to be installed. Referring to FIG. 2, adjacent cells in a string are connected in series by soldering one end of a flexible copper ribbon 8 to the back electrode of one solar cell and soldering the opposite end of the same ribbon to a bus bar of the front contact on the next succeeding solar cell.

Overlying the cells is a stiff or rigid, planar light-transmitting and electrically non-conducting cover member 10 in sheet form that also functions as part of the cell support structure. Cover member 10 has a thickness in the range of about ⅛" to about ⅜", preferably at least about ¼", and has an index of refraction between about 1.3 and 3.0. By way of example, cover member 10 may be made of glass or a suitable plastic such as a polycarbonate or an acrylic polymer.

Interposed between back sheet 6 and transparent cover member 10 and surrounding the cells 4 and their electrical connector ribbons 8 is an encapsulant 14 which is made of suitable light-transparent, electrically non-conducting material. Preferably encapsulant 14 is the ethylene vinyl acetate copolymer known in the trade as "EVA", or an ionomer. A common practice is to introduce the encapsulant in the form of discrete sheets that are positioned below and on top of the array of solar cells, with those components in turn being sandwiched between the back sheet 6 and the cover member 10. Subsequently that sandwich is heated under vacuum, causing the encapsulant sheets to become liquified enough to flow around and encapsulate the cells and simultaneously fill any voids in the space between the front cover member and the rear support that may result from evacuation of air. On cooling the liquified encapsulant solidifies and is cured in situ to form a transparent solid matrix that envelops the cells and fully fills the space between the back sheet 6 and cover member 10 that is not occupied by the mutually spaced cells and the components that form their electrical interconnections. The encapsulant adheres to the front and back sheets 6 and 10 so as to form a laminated subassembly.

Regardless of how the laminated subassembly is made, it usually is provided with and secured to a surrounding frame 16, with a sealant 18 usually disposed between the frame and the edges of the laminated subassembly. The frame may be made of metal or molded of a suitable material such as an organic plastic or elastomer material. Although not shown, it is to be understood that a conventional module such as shown in FIGS. 1 and 2 also is provided with electrical terminals for connecting the module to another module or directly into an electrical circuit, with the terminals usually being affixed to the rear support sheet 6.

The present invention improves upon the Amick invention by substituting a less expensive but equally performing reflecting means for Amick's reflecting means with its machined or molded grooves. For convenience the invention is described and illustrated hereinafter in the context of adding a novel textured reflector material to the conventional module structure shown in FIGS. 1 and 2, so that the textured material extends along the spaces between adjacent cells and also any spaces bordering the array of cells.

Figure 3:
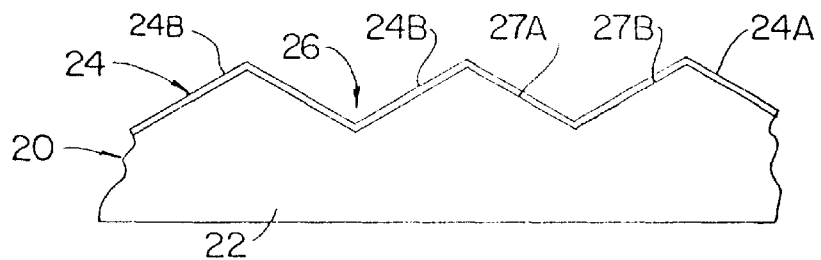
FIG. 3 is a fragmentary side elevation on a greatly enlarged scale of a preferred form of textured reflective laminated film material provided according to the present invention.

FIG. 3 is a side elevation of a portion of a preferred form of textured material 20 that is used as a reflector means according to the present invention. The reflector material is textured by the presence of grooves as hereinafter described so that it is capable of reflecting light which normally impinges on the land areas between and around the cells in the module at an angle such that the reflected radiation, when it reaches the front surface of the cover member, will be totally internally reflected back down to the array of solar cells. The textured material comprises a substrate in the form of a thin and flexible thermoplastic film 22 that is coated on one side with a light reflecting metal film 24. The substrate is formed with a plurality of contiguous V-shaped grooves 26 each defined by a pair of flat mutually converging surfaces 27A, 27B that extend at a predetermined angle to one another in the range of 110° to 130°, preferably about 120°, with the result that the portions 24A and 24B of the metal coating on those surfaces form light-reflecting facets. Since the angle between said facets is between 110° and 130°, each facet extends at an angle of between 25° and 35° relative to the plane of said cover member.

The textured material 20 is produced in several steps. First, the film 22 that serves as the substrate is manufactured as a continuous or extended web having flat front and back surfaces, and that continuous web is then wound onto a roll for subsequent processing, or it may be passed directly to subsequent processing stages. The subsequent processing comprises first embossing the film so as to form the V-shaped grooves on one side, and then metallizing the grooved surface of the film. Preferably, the embossing is accomplished by passing the film between a pinch roller and an embossing roller, the pinch roller having a smooth cylindrical surface and the embossing roller having a plurality of contiguous V-shaped ridges on its cylindrical surface with the ridges extending around the periphery of the embossing roller. The embossing roller ridges are reverse (negative) images of the desired V-shaped grooves in shape and depth. The film is heated so that as it passes between the two rollers it is soft enough to be shaped by the ridges on the embossing roller. The grooves formed by the ridges are fixed in shape on cooling of the film. After formation of grooves 26, the plastic film is subjected to a metallizing process wherein the adherent metal film 24 is formed. Preferably, but not necessarily, this is done by a conventional vapor deposition process on a continuous basis as a second stage in a high speed machine that includes an embossing first stage and means for transporting the continuous plastic film through its various stages at a relatively high speed. The metallized film is wound on a roll for subsequent use as a light reflector means as herein described. Subsequently pieces are cut from the rolled metallized film for use as light reflector means according to the invention.

Still referring to FIG. 3, the substrate is made of a plastic film material which is thermoplastic and which may be transparent, translucent or opaque. For reasons of cost and ease of use, a readily available plastic film is preferred for the substrate 22, with the film being sufficiently flexible to allow it to be stored in roll form. One suitable substrate material is polyethylene terephthalate, one form of which is sold as a transparent film wound in rolls under the trademark Mylar®. Other plastic films also may be used. By way of example but not limitation, the substrate may be a film made of other polyesters or a polyolefin such as polyethylene or polypropylene. Still other plastic films will be obvious to persons skilled in the art.

It has been determined that a satisfactory flexible textured reflector sheet can be made using as the substrate a plastic film having a thickness in the range of 4 to 10 mils (0.004 to 0.010 inch). Preferably the substrate has a thickness of about 5 mils. Currently aluminum is preferred as the reflective metal coating for reason of cost, but silver may become the preferred coating since its reflectivity is sufficiently higher than aluminum to offset the difference in cost. In this context it should be noted that aluminum has a reflectivity of about 80–85% while silver has a reflectivity of 95–98%. The metal is applied in a very thin coating in the order of Angstrom units, preferably having a thickness in the range of 300 Å to 1000 Å, more preferably between 300 Å to 500 Å. By way of example, in a substrate having a thickness of about 0.005 inch and V-shaped grooves with an included angle between 110° and 130°, the grooves have a depth of about 0.002 inch and a repeat (peak-to-peak) spacing of about 0.007 inch.

The textured material 20 is disposed so that it occupies the spaces ("land areas") between cells in a module. Because of the above-described geometry of grooves 26, light reflected from one facet is not blocked by any adjacent facet and instead light reflected from the facets and passing into the transparent cover member will strike the front face of the cover member at an angle exceeding the critical angle, with the result that substantially all of the reflected light is reflected internally back toward the solar cells, thereby substantially improving the module's electrical current output.

Figure 4:
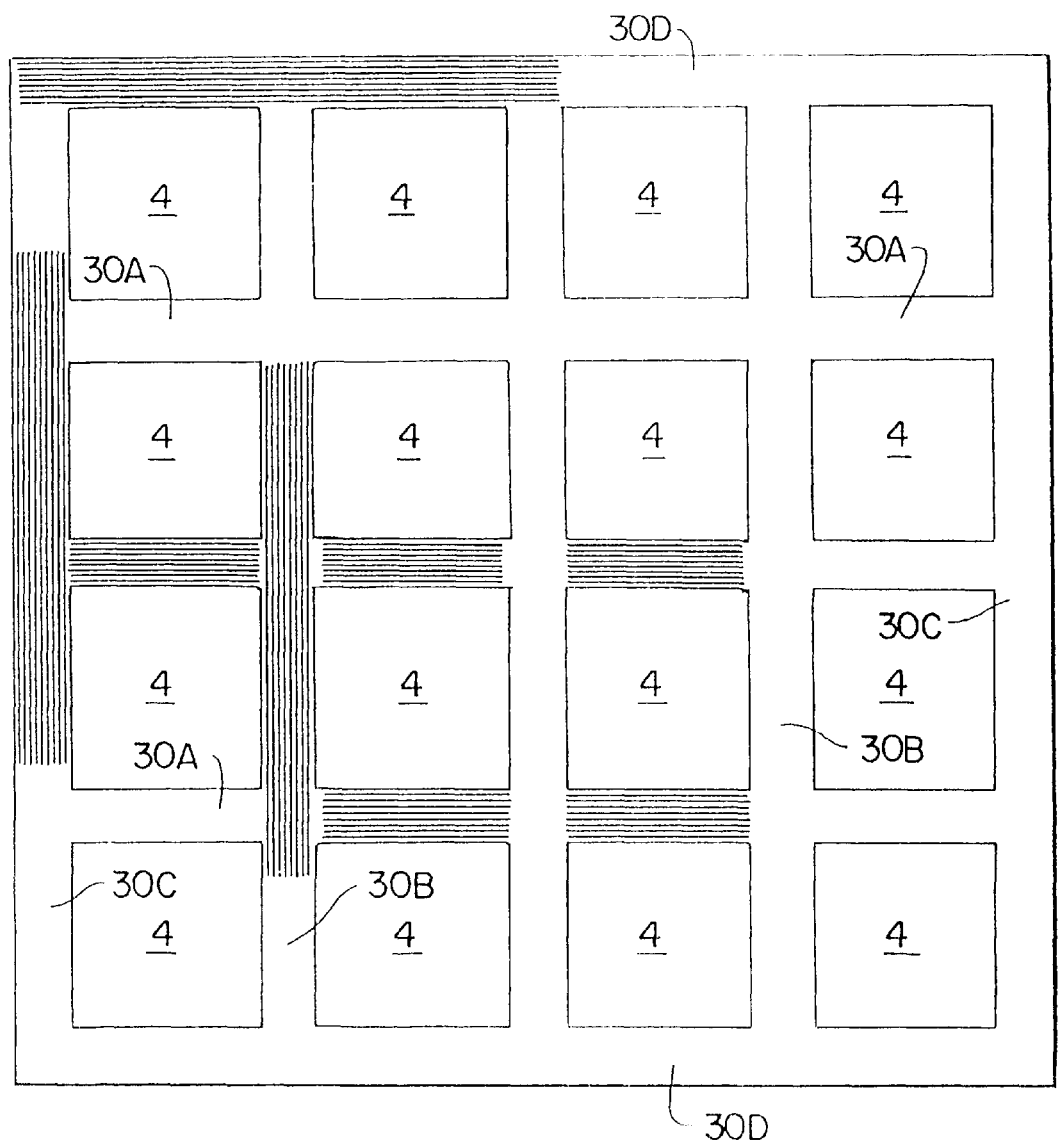
FIG. 4 is a diagrammatic illustration of how the textured reflective material of FIG. 3 is used in a solar cell module.

FIG. 4 illustrates how the textured laminated reflector material of FIG. 3 is used in a module. Essentially the laminated sheet material 20 is disposed in the areas 30A between adjacent rows of cells and the areas 30B between adjacent columns of cells, and also in the areas 30C and 30D that border the array of cells. The textured material is disposed so that in FIG. 4, for example, the grooves 26 extend horizontally in the areas 30A and 30D and vertically in areas 30B 30C. For convenience and simplicity, only some of the grooves 26 are shown in FIG. 4 and then only part of their full length. However, it is to be understood that the grooves extend for the full expanse of the land areas 30A, 30B, 30C and 30D.

Figure 5:
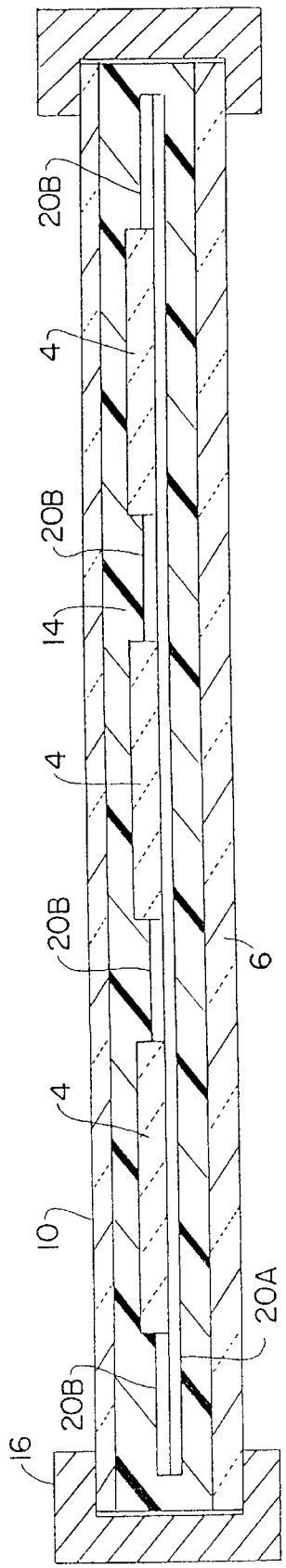
FIG. 5 is a diagrammatic illustration of one embodiment of the present invention.

FIG. 5 illustrates one way that the arrangement shown in FIG. 4 can be achieved. In this case, a sheet 20A of the laminated reflector film material of FIG. 3 is placed under the array of cells, the sheet being large enough to protrude beyond the periphery of the array, with the grooves of that sheet extending in the same direction in land areas 30A, 30B and 30C. Then an additional length of the same laminated reflector film material is cut into strips 20B with the grooves running lengthwise of the strips, and those strips are then placed over sheet 20 in those portions of areas 30A that lie between adjacent areas 30B and also between areas 30B and 30C, and the areas 30D between areas 30C so that the grooves of members 20A and 20B provide a pattern as shown in FIG. 4. More specifically, a plurality of grooves are disposed between and extend parallel to vertical columns of cells while additional grooves are disposed between and extend parallel to the cell rows. This arrangement has been found to be advantageous in that only one form of texturized reflector sheet material is required to be used, while having the grooves between adjacent rows oriented at a right angle to the grooves between columns improves the amount of light that is internally reflected from the areas between the cells back onto the front surfaces of the cells.

Figure 6:
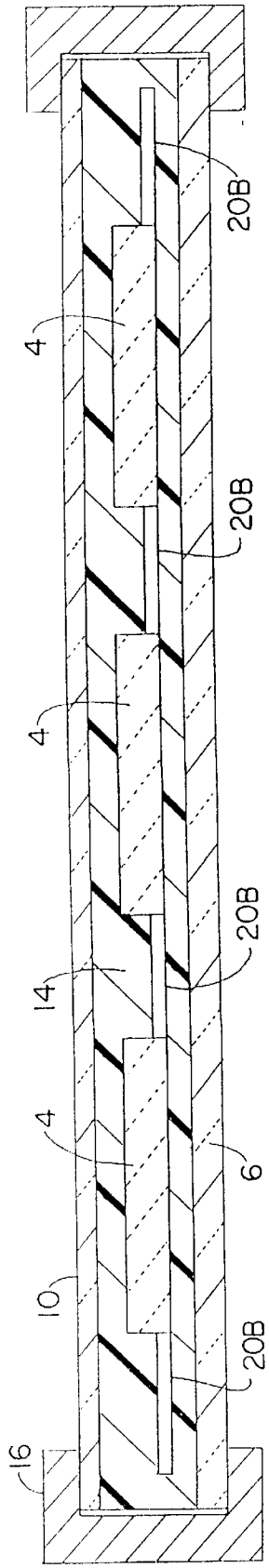
FIG. 6 is a diagrammatic illustration of another embodiment of the present invention.

FIG. 6 illustrates a second way to obtain a patterned groove arrangement as shown in FIG. 4 using a laminated plastic film as shown in FIG. 3. In this case, the laminated sheet 20A is omitted and instead the laminated plastic film having parallel grooves running along its length is cut into a plurality of strips 20B, each having the grooves 26 running lengthwise, and one of those strips is placed in each of the land areas 30A and 30D so that their grooves extend horizontally as viewed in FIG. 4, and additional like strips (not shown) are placed in areas corresponding to land areas 30B and 30C of FIG. 41 so that their grooves extend vertically as seen in FIG. 4. It should be appreciated that at the intersections of land areas 30B and 30C with land areas 30A and/or 30D, the grooves may extend either horizontally or vertically.

Figure 7:
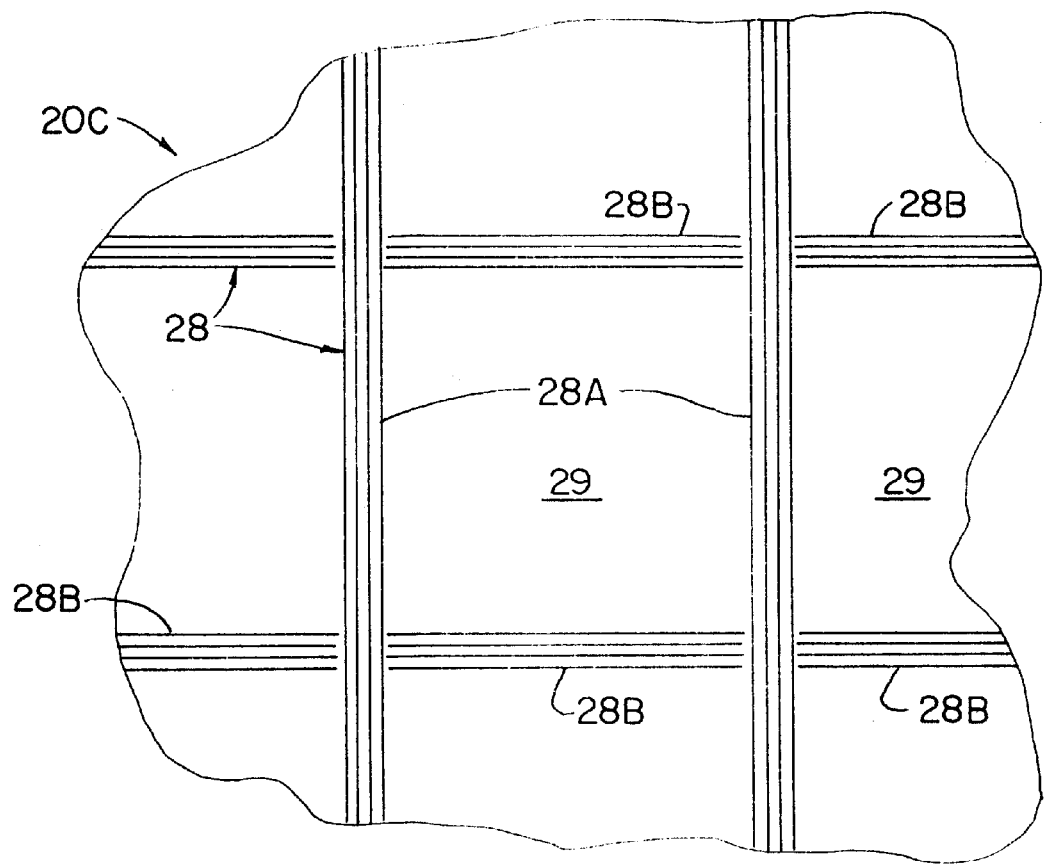
FIG. 7 is a fragmentary view of a portion of a preferred form of the reflective laminated film provided according to the invention.

FIG. 7 is a fragmentary plan view of a preferred form of laminated plastic film reflector material 20C. It is to be understood that material 20C also comprises a plastic film that has grooves formed by embossing as above described and also a metal film covering and following the contour of the grooves. However, in this case the embossing roll (not shown) is designed to emboss a rectangular pattern of grooves 28 that have a cross-sectional shape like grooves 26, certain of the grooves 28A extending lengthwise in one direction and the remaining grooves 28B extending at a right angle to grooves 28A, thereby leaving rectangular flat areas 29 each of which is sized so that a solar cell 4 will fit in that area. The laminated film material can be made wide enough so that the number of rectangular areas 29 formed across its width is equal to the number of cells in a row or column of cells in an intended module, in which case the web of laminated film can be severed into discrete pieces having areas 29 equal in number to the number of cells in an intended module.

Figure 8:
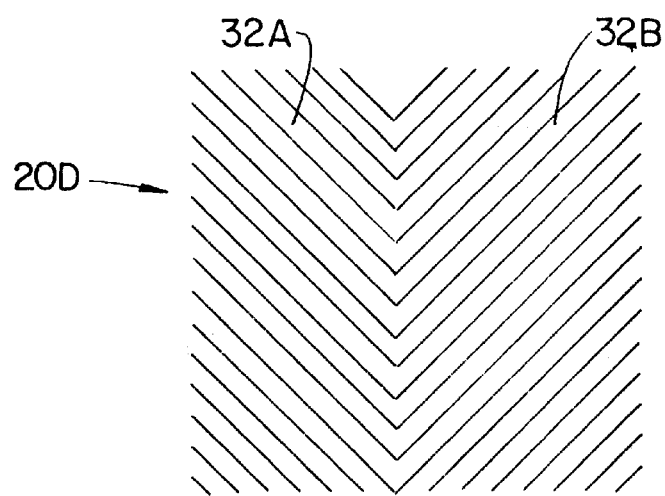
FIG. 8 illustrates another form of reflective laminated film material according to this invention.

FIG. 8 shows another form of laminated plastic film 20D. In this case the film is embossed with a herringbone pattern of grooves 32A and 32B. This material may be used in place of sheet 20A in which case strips 20B may be omitted from the embodiment of FIG. 5, or it may be cut into strips and used in place of strips 20B in the embodiment of FIG. 6.

An example of the manufacture of modules incorporating the laminated plastic film material provided by this invention is accomplished according to the following method and the technique illustrated in FIG. 6. An array of cells are disposed on the back sheet 6 over a sheet of encapsulant such as EVA or ionomer. The cells are interconnected to one another and also to output terminals on the back sheet as previously described. Then pieces of said laminated plastic film material, cut into suitable shapes, are positioned in the spaces between the cells as described in connection with FIG. 6. Next another sheet of encapsulant is placed over the cells and covered by a transparent front cover sheet made of glass or plastic. Finally the module is heated under vacuum to cause the two sheets of encapsulant to fuse to one another and to the exposed surface areas of the back sheet, the front cover, the cells and the laminated plastic film material. This module is then available for mounting in a frame for subsequent use.

Alternatively, the module may be assembled in reverse fashion, with the transparent glass or plastic sheet serving as the support for the module components during module assembly. In this method a layer of encapsulant would be placed over the transparent sheet with the cells placed face down on this layer. A second relatively thin layer of encapsulant would be laid over the rear of the cells, and a textured sheet as in FIG. 7 laid face down over the second encapsulant sheet with its grooves facing down. Then a third thin encapsulant sheet is placed over the textured reflector sheet and that is covered by a back sheet made of glass. Then the foregoing sandwich is laminated under heat and vacuum as previously described.

The following demonstrates the amount of improvement provided by this invention. Ten cell coupons were made using EVA as the encapsulant and 0.25 inch thick glass as the front cover sheet. Each coupon comprised one solar cell measuring 100 mm. on each side. Each cell was surrounded by 4 strips of laminated reflector material, one strip along each side of the cell, with the grooves running in one direction along two opposite sides of the cell and at a second direction at a right angle to the first direction along the other two sides of the cell, essentially in a pattern like that of FIG. 4. The laminated reflector material consisted of 0.005 inch thick Mylar® film having an aluminum coating approximately 400 Å thick on its top surface. The Mylar® film had been embossed before being metallized, the embossing producing V-shaped grooves having an included angle of about 120°, a depth of about 0.002 inch and a repeat spacing of about 0.007 inch. Each strip of laminated film measured about 25 mm. wide. These coupons, and another coupon having no reflector material but with an opaque mask surrounding it, were tested by illuminating each cell with a solar simulator light source and measuring the short circuit current. The 10 coupons having the laminated reflecting plastic film showed improvements in output power ranging from 20.8 to 25.6% greater than the power output of the cell that did not have the novel reflecting medium. It has been found also that a like cell surrounded by a flat white surface showed an output power increase no better than about 10% greater than the cell having no reflecting medium.

The invention also includes the concept of replacing the reflective metal coating on the plastic film with a dielectric stack comprising multiple layers of inorganic materials such as $SiO_2$, and $Si_3N_4$ arranged so as to form a reflecting mirror. Dielectric mirrors are well known; see A. Scherer et al, "Reactive Sputter Deposition of High Reflectivity Dielectric Mirror Stacks", J. Vac. Sci. Technol. (1993). Plastic film with dielectric mirror coatings are available commercially from various companies.

The invention also contemplates installing the laminated reflecting material consisting of a transparent plastic film substrate and a metal coating on its grooved surface so that the metal coating is facing away from the transparent cover sheet so as to avoid any possibility of the metal film short circuiting the cells.

The invention is not limited in its application to any particular kind of solar cell, or solar cell encapsulant or cover sheet or back sheet. The invention is susceptible of various modifications that will be obvious to persons of ordinary skill in the art.

What is claimed is:

1. A solar cell module comprising:
    a support structure having a planar surface adapted to support an array of solar cells;
    a plurality of solar cells overlying said planar surface, said cells having front and back surfaces with said back surfaces facing said planar surface, said cells being spaced from one another in an array of rows and columns, whereby predetermined areas of said planar surface are free of solar cells;
    a transparent cover member overlying and spaced from all of said solar cells;
    a light-reflecting medium overlying said predetermined areas of said planar surface, said light-reflecting medium comprising a flexible laminated sheet material in the form of a flexible plastic film coated with a light-reflecting coating, said laminated sheet material having a thickness less than the thickness of said cells, said plastic film being textured by embossing so that said laminated sheet material has a plurality of light-reflecting facets each having a predetermined angular relationship with respect to said cover member and said planar surface, whereby light impinging on said facets is reflected back to said transparent cover member at an angle relative to said cover member which is greater than the critical angle, whereby said reflected light is internally reflected by said cover member back toward said solar cells.

2. The module of claim 1 wherein said laminated sheet material has a plurality of parallel V-shaped grooves with said facets constituting the sides of said grooves.

3. The module of claim 2 wherein said grooves have a depth less than the thickness of said plastic film.

4. The module of claim 2 wherein each facet extends at an angle between 25 and 35 degrees relative to the plane of said cover member.

5. The module of claim 2 wherein said plastic film has a thickness in the range of 0.004 inch to 0.010 inch, and said grooves have a depth of approximately 0.002 inch.

6. The module of claim 5 wherein said grooves have a repeat spacing of about 0.007 inch.

7. The module of claim 2 wherein said plastic film has a thickness in the range of 0.004 inch to 0.010 inch and said grooves have a repeat spacing of about 0.007 inch.

8. The module of claim 2 wherein said light-reflecting medium comprises several pieces of said laminated sheet material disposed so that said grooves extend in a first direction between adjacent rows of cells and a second direction between adjacent columns of cells.

9. The module of claim 2 wherein said flexible laminated sheet material has a first plurality of grooves extending parallel to one another and a second plurality of grooves extending parallel to one another but at an angle to said first plurality of grooves.

10. The module of claim 9 wherein said solar cells have a rectangular shape, and said first and second pluralities of grooves are arranged to define a plurality of rectangular open areas sized to accommodate said solar cells, and said laminated sheet material is disposed so that each of said open areas is covered by a solar cell and said grooves are located in spaces between solar cells.

11. The module of claim 2 wherein said grooves have a depth of approximately 0.002 inch.

12. The module of claim 1 wherein said light-reflecting medium comprises a film of a flexible thermoplastic organic polymer and said coating is made of aluminum or silver.

13. The module of claim 12 wherein said organic polymer is a polyethylene terephthalate material.

14. The module of claim 12 wherein said coating is made of aluminum or silver.

15. The module of claim 12 wherein said coating is made of silver.

16. The module of claim 12 wherein said coating is made of aluminum.

17. The module of claim 1 wherein said cells and said light-reflecting medium are encapsulated in a light transmitting polymer material that extends to and is bonded to said cover member and said planar surface of said support structure, with said light transmitting polymer being engaged with and bonded to said light-reflecting medium.

18. The module of claim 1 wherein said flexible laminated sheet material is interposed between said cells and said planar surface of said support structure, and further wherein said cells and said laminated sheet material are encapsulated in a light transmitting polymer material that extends to and is bonded to said cover member and said planar surface of said support structure.

19. The module of claim 18 wherein said plastic film has a plurality of parallel V-shaped grooves with said facets constituting the sides of said grooves, and further wherein said grooves have a depth of approximately 0.002 inch.

20. In a solar cell module having a plurality of electrically interconnected solar cells arrayed in rows and columns on a planar surface of a support structure with at least some of said cells being spaced from one another so that selected areas of said planar surface are not covered by said cells, a light-transparent cover member overlying and spaced from said cells, and a light-transparent solid medium overlying and encapsulating said cells, said light-transparent solid medium being bonded to said cover member, the improvement comprising:

a flexible laminated light-reflecting medium overlying said planar surface in said selected areas and encapsulated by said light-transparent solid medium, said light-reflecting medium comprising a flexible plastic film that has a front surface facing said cover member and a rear surface and which has been embossed at said front surface so that said front surface defines a plurality of V-shaped grooves each having an included angle between 110° and 130°, and a reflective film covering and bonded to said front surface, said reflective film conforming to the shape of and being coextensive with said grooves whereby portions of said reflective film covering the sides of said grooves form a plurality of light reflective facets that are bonded to said light-transparent solid medium, each of said facets extending at an angle to said cover member such that light impinging on said facets will be reflected upwardly through said light-transparent solid material into said transparent cover member and then downwardly through said light-transparent sold material toward said cells.

21. The improvement of claim 20 wherein said grooves each have a depth of approximately 0.002 inch.

22. The improvement of claim 20 wherein the geometry of said grooves is such that incident light normal to the solar cell module which impinges on said light-reflecting medium will be reflected by said reflective facets back through said light-transparent solid medium to said cover member at an angle to said cover member which is greater than the critical angle.

23. The improvement of claim 20 wherein said film has a thickness in the range of 0.004 inch to 0.010 inch.

24. The improvement of claim 20 wherein said grooves have a repeat spacing of approximately 0.007 inch.

25. A solar cell module comprising:

a structure adapted for supporting an array of solar cells;

a plurality of solar cells arrayed on said support structure so that selected areas of said support structure are exposed;

a light-reflecting medium disposed in said selected areas so as to extend into proximity with each adjacent cell bordering said areas;

a light-transparent cover member overlying and spaced from said solar cells, said cover member being parallel to said support structure and the planes of said solar cells, said cover member having an index of refraction between 1.3 and 3.0; and a light-transparent optical medium covering said cells and said light-reflecting medium, said light transparent optical medium extending to and being bonded to said cover sheet;

said light-reflecting medium comprising a flexible laminated sheet material in the form of a flexible plastic film with a thickness between 0.004" and 0.010" that has front and rear surfaces and has been embossed so that said front surface is characterized by a plurality of V-shaped grooves, and a light-reflecting metallic coating covering said front surface of said plastic film, portions of said metallic coating on the areas of said front surface that define said plurality of grooves forming light-reflecting facets, said grooves having a geometry such that light passing through said light transparent optical medium and impinging on said light-reflecting facets will be reflected upwardly through said optical medium to said cover member and thereafter internally reflected downwardly from said cover member through said light transparent optical medium to said solar cells.

26. A module according to claim 25 wherein said cells have a rectangular shape and are arranged in rows and columns, and further wherein said light-reflecting medium comprises strips of said flexible laminated sheet material disposed between adjacent rows of cells and also between adjacent rows of cells.

27. A method of increasing the output current of a given solar cell module having a back sheet, a transparent front cover sheet, and a plurality of solar cells arrayed on said back sheet between said back sheet and said cover sheet, said array of cells defining land areas therebetween, said method comprising:

(1) placing in said land areas a flexible light-reflecting laminated sheet material comprising a flexible plastic film having front and rear surfaces and a thin reflective coating on said front surface facing said cover sheet, said plastic film having a plurality of V-shaped grooves embossed in said front surface, portions of said reflective coating along said grooves forming flat light-reflecting facets with said facets oriented as an angle of between 25 and 35 degrees to said cover sheet; and (2) reflecting solar radiation impinging on said facets via said transparent cover sheet back into said transparent cover sheet so that said reflected solar radiation will be reflected internally from said cover member downwardly toward said solar cells, whereby light impinging on said facets is directed onto said solar cells and thereby increases the output current of said solar cell module.

28. A method of increasing the output current of a given solar cell module having a back sheet, a transparent front cover sheet, and a plurality of solar cells arrayed on said back sheet between said back sheet and said cover sheet, said array of cells defining land areas therebetween, said method comprising:

providing an extended length web of a flexible plastic film having flat front and back surfaces and a thickness in the range of 0.004 to 0.010 inch;

embossing said front surface of said plastic film so as to form parallel V-shaped grooves therein each having a depth of approximately 0.002 inch and an included angle in the range of 110° to 130°;

coating said embossed front surface of said plastic film with a reflective coating having a thickness of about 1000 Angstroms or less so as to form a laminated film material comprising said plastic film and said coating, with portions of said coating along said grooves forming light-reflecting facets;

severing at least one selected length of said laminated film material from said web and placing said at least one selected length in said land areas between said back sheet and said front cover sheet so that the widest portions of said grooves face said cover sheet; and reflecting solar radiation impinging on said facets via said transparent cover sheet back into said transparent cover sheet so that said reflected solar radiation will be reflected internally from said cover member downwardly toward said solar cells, whereby light impinging on said facets is directed onto said solar cells and thereby increases the output current of said solar cell module.

29. The method of claim 28 wherein said cells are rectangular in shape and are arranged in rows and columns, and further wherein several lengths of said laminated film material severed from said web are placed in said land areas so that between said rows said grooves run parallel to said rows and between said columns said grooves run parallel to said columns.

30. A method of manufacturing a solar cell module comprising the following steps:

providing an extended length web of a flexible plastic film having flat front and back surfaces and a thickness in the range of 0.004 to 0.010 inch;

embossing said front surface of said plastic film so as to form contiguous parallel V-shaped grooves therein, with each groove having an included angle in cross section in the range of 110 to 130 degrees;

coating said embossed front surface of said plastic film with a reflective coating having a thickness of about 1000 Angstroms or less so as to form a laminated film material comprising said plastic film and said reflective coating, with portions of said reflective coating along said grooves forming light-reflecting facets;

severing at least one selected length of said laminated film material from said web;

providing a back sheet, a transparent front cover sheet, and a plurality of solar cells arrayed on said back sheet with land areas between said cells;

placing said at least one selected length of said laminated film material in said land areas in overlying relation with said back sheet, with the widest portions of said grooves facing away from said back sheet; and sealing said cells and said laminated film material to said cover sheet and said back sheet with a polymeric light-transmitting medium that is interposed between and bonded to said cover sheet and said back sheet and encapsulates said cells and said at least one selected length of said laminated film material, whereby to form a sealed solar module.

31. The method of claim 30 wherein said reflective coating is a metal film or comprises a plurality of dielectric films.

32. The method of claim 30 wherein said grooves have a depth of approximately 0.002 inch.

33. A method of manufacturing a solar cell module comprising the following steps:

providing an extended length web of a laminated film material that comprises (a) a flexible plastic film having flat front and back surfaces and a thickness in the range of 0.004 to 0.010 inch, with said front surface of said plastic film embossed so as to form contiguous parallel V-shaped grooves therein with each groove having in cross-section an included angle in the range of 110 to 130 degrees, and (b) a reflective coating on said front surface having a thickness of about 1000 Angstroms or less, with portions of said reflective coating along said grooves forming light-reflecting facets;

severing at least one selected length of said laminated film material from said web;

providing a back sheet, a transparent front cover sheet, and a plurality of solar cells arrayed on said back sheet with land areas between said cells;

placing said at least one selected length of said laminated film material in said land areas in overlying relation with said back sheet, with the widest portions of said grooves facing away from said back sheet; and sealing said cells and said laminated film material to said cover sheet and said back sheet with a polymeric light-transmitting medium that is interposed between and bonded to said cover sheet and said back sheet and encapsulates said cells and said at least one selected length of said laminated film material, whereby to form a sealed solar module.

34. A solar cell module comprising:

a support structure having a planar surface adapted to support an array of solar cells;

a plurality of solar cells arrayed on said planar surface, said cells having front and back surfaces with said back surfaces facing said planar surface, said cells being spaced from one another in an array of rows and columns, whereby predetermined areas of said planar surface are free of solar cells;

a transparent cover member overlying and spaced from all of said solar cells;

a light-reflecting medium overlying said predetermined areas of said planar surface, said light-reflecting medium comprising a flexible laminated sheet material in the form of a flexible plastic film having a thickness in the range of 0.004 inch to 0.010 inch and coated with a light-reflecting coating having a thickness substantially less than the thickness of said plastic film, said plastic film being textured by embossing so that said laminated sheet material has a plurality of V-shaped grooves each having an included angle in the range of 110° to 130° with the sides of said grooves functioning as light-reflecting facets, whereby light impinging on said facets is reflected back to said transparent cover member at an angle relative to said cover member which is greater than the critical angle, whereby said reflected light is internally reflected by said cover member back toward said solar cells; and a light-transmitting polymer material disposed between and bonded to said cover member and said support structure in encapsulating relation with said solar cells and said light-reflecting medium.

35. A solar cell module according to claim 34 wherein said light-transmitting polymer material is EVA or an ionomer.

36. A solar cell according to claim 35 wherein said plastic film is a polyester or a polyolefin.

* * * * *